United States Patent
Chih et al.

(10) Patent No.: US 8,902,641 B2
(45) Date of Patent: Dec. 2, 2014

(54) ADJUSTING REFERENCE RESISTANCES IN DETERMINING MRAM RESISTANCE STATES

(75) Inventors: Yue-Der Chih, Hsin-Chu (TW);
Chin-Yi Huang, Hsinchu (TW);
Chun-Jung Lin, HsinChu (TW);
Kai-Chun Lin, Hsinchu (TW);
Hung-Chang Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 265 days.

(21) Appl. No.: 13/443,056

(22) Filed: Apr. 10, 2012

(65) Prior Publication Data

US 2013/0265820 A1    Oct. 10, 2013

(51) Int. Cl.
*G11C 11/16* (2006.01)
*G11C 11/15* (2006.01)

(52) U.S. Cl.
CPC ............... *G11C 11/16* (2013.01); *G11C 11/15* (2013.01)
USPC ........................................................ 365/158

(58) Field of Classification Search
CPC ......... G11C 11/15; G11C 11/16; H01L 43/08
USPC ........................................................ 365/158
See application file for complete search history.

(56) References Cited

U.S. PATENT DOCUMENTS

| | | | |
|---|---|---|---|
| 6,697,294 B1 | 2/2004 | Qi et al. | |
| 6,856,537 B2 * | 2/2005 | Tanizaki et al. | ............... 365/158 |
| 7,233,537 B2 * | 6/2007 | Tanizaki et al. | ............... 365/209 |
| 7,283,407 B2 | 10/2007 | Inoue et al. | |
| 7,952,916 B2 * | 5/2011 | Maeda et al. | ................. 365/158 |
| 8,004,880 B2 | 8/2011 | Yoon et al. | |

(Continued)

FOREIGN PATENT DOCUMENTS

| | | |
|---|---|---|
| DE | 102005052508 A1 | 5/2006 |
| KR | 100223279 B1 | 10/1999 |
| KR | 10-2011-0078181 | 7/2011 |
| KR | 10-2012-0063736 | 6/2012 |

OTHER PUBLICATIONS

Kim, J.P. et al., "A 45nm 1Mb Embedded STT-MRAM with design techniques to minimize read-disturbance", 2011 Symposium on VLSI Circuits (VLSIC), Jun. 2011, pp. 296-297.

(Continued)

*Primary Examiner* — Hoai V Ho
*Assistant Examiner* — Tri Hoang
(74) *Attorney, Agent, or Firm* — Duane Morris LLP

(57) ABSTRACT

Magneto-resistive memory bit cells in an array have high or low resistance states storing logic values. During read operations, a bias source is coupled to an addressed memory word, coupling a parameter related to cell resistance to a sense amplifier at each bit position. The sense amplifiers determine whether the parameter value is greater or less than a reference value between the high and low resistance states. The reference value is derived by averaging or splitting a difference of resistances of reference cells at high and/or low resistance states. Bias current is conducted over address lines with varying resistance, due to different distances between the sense amplifiers and addressed memory words, which is canceled by inserting into the comparison circuit a resistance from a dummy addressing array, equal to the resistance of the conductor addressing the selected word line and bit position.

19 Claims, 10 Drawing Sheets

(56) References Cited

U.S. PATENT DOCUMENTS

2006/0092689 A1 5/2006 Braun et al.
2011/0157971 A1 6/2011 Kim et al.
2012/0147664 A1* 6/2012 Rho ............................. 365/158

OTHER PUBLICATIONS

Huai, Y., "Spin-Transfer Torque MRAM (STT-MRAM):Challenges and Prospects", AAPPS Bulletin, Dec. 2008, 18(6):33-40.

Chen, Y. et al., A Nondestructive Self-Reference Scheme for Spin-Transfer Torque Random Access Memory (STT-RAM), Automation & Test in Europe Conference & Exhibition Design, Mar. 2010, pp. 148-153.

Hai, H. et al., "Design Methodologies and Circuit Techniques for Emerging Non-Volatile Memories", 23 pages.

Official Action issued Dec. 4, 2013, by German Patent Office in counterpart German patent application.

Official Action issued Jul. 24, 2013, in counterpart Korean Patent Application No. 10-2012-0071674.

Official Action issued Jul. 21, 2014, in counterpart Korean Patent Application No. 10-2012-0071674.

* cited by examiner

ADJUSTING REFERENCE RESISTANCES IN DETERMINING MRAM RESISTANCE STATES

BACKGROUND

This disclosure relates to integrated circuit memories wherein distinct binary logic values are represented by changeable high electrical resistance and low electrical resistance states of magneto-resistive memory elements contained in bit cells. During memory read operations, the different resistance states are distinguished using sense amplifiers that are switchably coupled to addressed bit cells. A sense amplifier compares a resistance-related parameter of an addressed bit cell, such as current amplitude at a given bias voltage, versus a related parameter in a reference circuit comprising reference magneto-resistive elements that produce a threshold level for comparison with the bit cell.

This disclosure provides for reducing the effects of differences in resistance among reference elements using certain averaging techniques, and also offsets the variation in the resistance of the conductors of different lengths, that switchably couple addressed bit cells to a sense amplifier. Conductors of a length comparable to the conductors addressing a bit cell are inserted into the reference circuit when the bit cell is read so as to offset resistance variation with differences in the length of addressing conductors.

A spin-transfer torque magnetoresistive random access memory (STT-MRAM) stores binary data values in the resistance states of magnetic tunnel junction (MTJ) memory elements. A magnetic tunnel junction or MTJ has superimposed magnetic layers separated by a nonmagnetic film or barrier layer, such as magnesium oxide. The two magnetic layers have magnetic fields that can be aligned in the same orientation (parallel to one another) or in directly opposite orientations (anti-parallel). These relative magnetic field orientations are two distinct states at which the MTJ will remain stable without application of electrical power.

In the state of parallel field orientations, the MTJ has a relatively lower serial resistance $R_L$ through the magnetic and barrier layers. In the antiparallel field orientation state, the MTJ has a relatively higher serial resistance $R_H$. During write operations, the MTJ can be switched from the high resistance state (with anti-parallel magnetic fields) to the low resistance state (with parallel magnetic fields), or vice versa, using write currents of sufficient amplitude and with respectively opposite current polarities. During read operations, a read bias voltage (or current) is applied across an addressed bit cell MTJ element and the current (or voltage) resulting under Ohm's Law V=IR is compared to a threshold characteristic of a resistance between RL and RH. The result of the comparison is deemed the logic level of the bit cell.

During a read operation, the resistance of an MTJ element can be expressed as a current or voltage. Various techniques can establish threshold levels for comparison. Various reference circuit configurations can distinguish between high resistance and low resistance states by comparison with the threshold. As one example, a voltage that varies with resistance can be generated by passing a read current of given amplitude through the MTJ element. The voltage is compared against a reference voltage to distinguish high and low resistance states. It is also possible to apply a given voltage and compare the resistance-dependent resulting current to a current comparison reference. The relatively higher and lower resistance states of one or more elements represent logical 'zero' or 'one' binary values of a bit cell.

The difference in resistance between $R_H$ and $R_L$ for given MTJ can be substantial, e.g., a difference in resistance of 100% or 200%. But the resistance values of the MTJ elements in their high and low resistance states ($R_H$ and $R_L$), and the difference between the resistances in the states of high and low resistance ($R_H$ minus $R_L$) vary among MTJ elements in a given integrated circuit memory. The values of resistance and the difference between $R_H$ and $R_L$ also vary from one integrated circuit to another.

Some of the variation in resistance, particularly from one integrated circuit to another, is due to normal manufacturing variations. Small differences in the thickness of the magnesium oxide barrier layer can produce substantial differences in resistance. The variations in resistance and in the span between $R_H$ and $R_L$ present challenges in the selection of a threshold value to use for comparison when distinguishing whether an MTJ being read is in its high or low resistance state. One might assume nominal values of $R_H$ and $R_L$, and set a comparison threshold halfway between the nominal $R_H$ and $R_L$, but that comparison threshold will not be the optimal value for all memory circuits or for all addressable MTJ bit cells on a given circuit, because the actual $R_H$ and $R_L$ resistances of the MTJ elements is distributed over a population.

An optimal threshold is well spaced from the values observed in most or all of the bit cells in their high and low resistance states, so that variations such as offset in the comparison circuit inputs, and variations in the absolute or differential resistances of the bit cell $R_H$ and $R_L$ values, do not cause read failures (namely inability to distinguish the two resistance states of an MTJ element of a bit cell accurately, repeatedly and dependably).

What is needed are practical ways to arrive at the most appropriate comparison threshold to be used in the read-sense amplifiers of individual integrated circuits, given the variation in $R_H$ and $R_L$ from one integrated circuit to another. One useful can be to include exemplary reference MTJ elements in a reference circuit coupled to the read-sense amplifiers to define the comparison threshold. One or more reference MTJ elements can be maintained in respective $R_H$ and $R_L$ states or switched between $R_H$ and $R_L$ states. The reference circuit produces from the reference MTJ element(s) a threshold to be used discriminating the resistance states of the bit cells. The threshold falls between the $R_H$ and $R_L$ levels of the reference MTJ elements, ideally halfway between $R_H$ and $R_L$. If manufacturing variations cause the $R_H$ and $R_L$ resistances of the bit cells on a circuit to trend high or low, then those manufacturing variations should also cause the resistances of the reference bit cells to trend in the same direction.

Using reference MTJ elements to define the basis of comparison when reading the bit cell MTJ elements is helpful but not a complete solution. There remains a variation in the resistance values of the MTJ elements on an integrated circuit. There are respective distributions of $R_H$ and $R_L$ in the populations of reference MTJ elements and also in the populations of bit cell MTJ elements, both on a given integrated circuit and among a population of integrated circuits.

Voltage, current and resistance parameters are related by Ohm's Law. The comparison circuit and the parameters that are used as the basis for comparison can be any parameters that vary with the resistances of MTJ elements (in the bit cells and/or in the reference MTJ elements) in their high and low resistance states. The parameters that are actually compared to distinguish resistance states may be voltages applied to a voltage comparator or current to a current comparator, etc., wherein the threshold defining comparator varies as a function of MTJ resistance. One typically does not measure or process a resistance value in a circuit. The measured or processed value is a voltage or current that varies due to changes in resistance.

In addition to the variations in $R_H$ and $R_L$ on an integrated circuit and between integrated circuits, the typical resistance levels $R_H$ and $R_L$, and/or the differences between the high and low resistance levels $R_H$-$R_L$, are not substantial compared to the resistances of conductive paths found in the integrated circuit, including the paths over which an addressed bit cell is coupled to the memory sense amplifier for purposes of comparison. The conductive paths, for example, may comprise polycrystalline silicon (or "polysilicon") of very limited width and thickness. Manufacturing variations affect the resistances that are coupled along such conductive paths in series with an addressed bit cell MTJ element whose resistance state is to be read. And the length of the conductive paths varies among the bit cell MTJ elements on an integrated circuit because some of the bit cell MTJ elements are in word lines that are near to their respective sense amplifiers (usually one sense amplifier being provided per bit position), and some are farther away. The polysilicon or other conductors contribute additional resistance variation to the $R_H$ and $R_L$ variation of the bit cell elements as a function of their distances from the sense amplifier.

If all sources of resistance variability other than the change of resistance state between $R_H$ and $R_L$ could be minimized, the ability of sense amplifiers to accurately discriminate for high and low resistance states would be improved, even assuming that sense amplifiers may have an offset at their inputs. The effectiveness of threshold comparison by the sense amplifiers is degraded by the variability of $R_H$ and $R_L$ resistances in bit cell MTJ elements and also in reference MTJ elements. That variability is aggravated by the additional variability in the resistance of conductors that switchably couple the sense amplifier at a bit position in a word to the corresponding bit cell MTJ in an addressed memory word at a variable distance from the sense amplifier. It would be advantageous to reduce or eliminate resistance variability, other than the change of resistance state, if it is possible to do so.

SUMMARY

It is an object of the present disclosure to provide an effective STT-MRAM configuration that accommodates a population of bit cells with varying high and/or low resistance values and high/low resistance ratios.

Each logical bit can be represented by the high-or-low resistance state of one or more magnetic tunnel junction (MTJ) elements forming a bit cell. The resistance of bit cell magnetic tunnel junction elements, when addressed, is coupled to an input of a sense amplifier operated as a comparator. Another input of the sense amplifier is coupled to a reference held at a parameter value that characterizes a comparison threshold between the $R_H$ and $R_L$ states of the bit cell MTJ, for the same parameter. Thus the output of the sense amplifier reads out the high or low resistance state of the bit cell, which can be regarded as a logic bit value stored in the bit cell MTJ element.

In certain embodiments, the parameter value from the reference circuit coupled to the sense amplifier to define the threshold for comparison is derived from paired reference MTJ elements. At least one reference MTJ element is held in its high resistance state $R_H$ and at least one MTJ element is held in its low resistance stated $R_L$. The threshold for comparison can be derived as a parameter value between the value of the parameter in the $R_H$ and $R_L$ resistance states of the two MTJ elements used as references, such as the average or approximate average of their resistance or voltage or current amplitude.

However, there is variability even between reference MTJ elements when two or more MTJ elements are used to produce parameter values that are used as references for one or more bit positions. An additional technique used herein to reduce the variability in the $R_H$ and $R_L$ resistances of the MTJ elements used as references, is to average resistances (or resistance-related parameter values). A plurality of reference MTJ elements in the $R_H$ state can be coupled to provide an average $R_H$ resistance; and another plurality of reference MTJ elements in the $R_L$ state can provide an average $R_L$ resistance. Alternatively, an equal number of instances of $R_H$ and $R_L$ states can be coupled in a way that derives their average resistance. The variability in the resistances of members of a population of two or more reference MTJ elements is moderated if the actual reference parameter is based on an average rather than the parameter value characteristic of one MTJ element alone.

Although instances of both $R_H$ and $R_L$ resistance states contribute to define the comparison threshold and an average or other intermediate parameter level between that of $R_H$ and $R_L$ states is employed, at least two such instances can be represented by switchable states of an MTJ element as opposed to having two MTJ elements that remain in different $R_H$ and $R_L$ states. That is, parameter values for $R_H$ and $R_L$ states can be collected by storing a value characterizing one or more reference MTJ elements in one state, whereupon the reference MTJ elements are switched to a complementary resistance states, and the reference value is determined as a level between those states.

Thus one technique disclosed herein for reading out values is to provide one or more dummy reference MTJ elements whose average resistance $((R_H+R_L)/2)$ is used as a reference for discriminating between high and low resistances in active MTJ memory elements. Instead of the average, the dummy reference MTJ elements can provide a different parameter value that is known to fall at an intermediate point, such as a parallel resistance value with an added series resistance.

The dummy MTJ element(s) are produced in the same process as the active bit cell MTJ elements whose resistance state is to be discriminated, e.g., being located on the same circuit chip and therefore equally affected by process variations with the dummy MTJ element(s). Multiple dummy elements can be provided and located on the circuit nearby the active elements for which the dummy elements provide references. In different configurations, one dummy element could be used to produce threshold comparison values for the bit cell MTJ's of an entire memory array. More practically, one or more dummy MTJ elements is provided for a sense amplifier at each bit position in an addressed word. According to embodiments that use averaging or other redundancy to temper the variability of reference or dummy MTJ elements at least two reference MTJ elements or $R_H$ and $R_L$ elements states contribute together to defining a reference threshold between the $R_H$ and $R_L$ states. And in certain embodiments, a plurality of MTJ dummy elements in each of the $R_H$ and $R_L$ states produce a comparison threshold with even less variation from one sense amplifier or bit position to another.

A change of the logical value of a bit cell having an MTJ element is accomplished by changing the alignment of the magnetic field of the free layer relative to the alignment of the pinned layer. A spin-transfer torque (STT) cell is advantageous in that the alignment of the magnetic field in the free layer can be changed simply by passing an appropriate write current through the magnetic tunnel junction MTJ element.

The write current needed to assume a given $R_H$ or $R_L$ state requires a given write current polarity at least at a minimum amplitude. Reading the value of a bit, namely detecting its resistance state, also involves passing a current through the MTJ element, but the polarity is unimportant except that if the read current is applied at the polarity that might cause the present $R_H$ or $R_L$ state of the MTJ element to change, the read current bias needs to be kept at a lower current amplitude than the minimum write current amplitude, so as to reduce the risk of changing or "disturbing" the logical value stored at the bit cell. A read disturb risk can arise in situations where there is a particular combination of present resistance state and read current bias polarity. Changing an MTJ element from its high resistance state to its low resistance state requires a write current polarity that is opposite from the polarity needed when writing from a low resistance state to a high resistance state.

The present resistance state $R_H$ or $R_L$ of bit cell MTJ elements is unknown because the logic values of the cells (the stored data values) are arbitrary. Any given cell might be found in a high or low resistance state. However, by taking appropriate care with the read bias current polarity applied to reference MTJ elements in a reference circuit, it may be possible to protect the reference MTJ elements from read disturb risk.

Accordingly, an array of magnetoresistive memory bit cells that uses changeable high and low resistance states in one or more magnetic tunnel junction elements to store logic values is arranged to provide for an improved capability to distinguish high and low resistance states, by selecting a reference resistance, voltage or current parameter level for use as a comparison threshold. The level used as a comparison threshold is spaced between the characteristic values of that parameter in the $R_H$ and $R_L$ states. In one embodiment, a current bias source supplies a read current to a reference circuit in which MTJ elements provide a comparison value to a sense amplifier. A bit cell MTJ element is addressed along conductors switchably addressed by transistors responsive to word and bit line signals and provides an input value to the sense amplifier. The comparison circuits of the sense amplifier determine whether the resistance of the addressed bit cell MTJ element is greater than or less than a reference value, thus reading the bit cell logic value.

The reference value or values used for comparison in distinguishing the high or low resistance states of one or more elements are determined using a plurality of reference MTJ elements and MTJ element states. The $R_H$ and $R_L$ resistances of individual MTJ elements are distributed over ranges of high and low resistance values according to a population. By averaging or otherwise factoring plural MTJ elements into defining a parameter value representing an average or the like between values in $R_H$ and $R_L$ states, and/or by using plural MTJ elements to contribute to either or both of the $R_H$ and $R_L$ states that contribute to a mean or average, the variability of the $R_H$ and $R_L$ resistances is tempered and the comparison threshold is optimized.

According to one aspect of this disclosure, a reference resistance applicable to reading at least a subset of the bit cell MTJ elements is determined by averaging the resistances of associated reference MTJ cells at high and/or low resistance states. The read current used to develop a voltage from an MTJ cell, for comparison against a reference voltage, is conducted over a bit line that addresses the MTJ cell. A resistance variation occurs due to variations in the length of bit lines between the current bias source and MTJ cells that are closer to or farther from the current source in the array. According to another aspect, this variation is wholly or partly canceled by inserting into the comparison circuit an offsetting a resistance equal to at least part of the resistance of the bit line. In one embodiment, the variable resistance is produced using a polysilicon conductor array that matches the materials and variable length of the bit lines addressing MTJ elements at each bit cell position in an array.

The reference value is applied to one sense amplifier input from the reference MTJ element(s) to provide a comparison switching threshold. The sensed bit cell MTJ value is addressably coupled to the other sense amplifier input to provide the data input to be compared against the comparison threshold. The addressing lines to the $R_H$ or $R_L$ resistance of the bit cell MTJ element contribute a resistance that varies with the location of the bit cell in the memory array. The data input to the sense amplifier or made directly comparable to comparison threshold input by inserting a variable resistance in series with the reference MTJ element(s) in an amount that offsets the variable resistance of the bit cell addressing conductors. Ideally, the reference used for comparison with the MTJ cells is coupled along conductors that follow a path of equal length as the distance of the bit cell MTJ element.

Additional objects and aspects of this disclosure will become evident from the following discussion of exemplary embodiments.

BRIEF DESCRIPTION

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings, FIG. 1 is a schematic diagram showing an array of bit cell magnetic terminal junction (MTJ) elements in an array such as an MRAM integrated circuit memory.

FIG. 2 is a histogram showing distributions of $R_H$, $R_L$ and the average of $R_H$ and $R_L$ for instances of bit cell MTJ elements in the array of FIG. 1.

FIG. 3 is a simplified schematic illustration of a bit cell MTJ element and a reference MTJ element coupled to a sense amplifier for determining a present logic value of the bit cell MTJ, detected by a high resistance state $R_H$ or low resistance state $R_L$ compared to an average resistance and arranged to balance a variable resistance associated with conductors coupling the bit cell MTJ to the sense amplifier.

Figure 7:
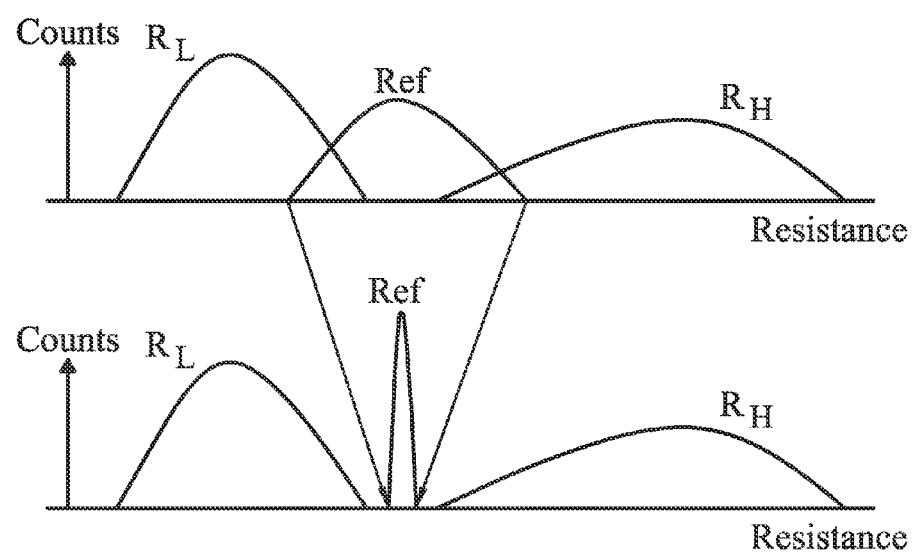

FIG. 7 is a comparison of two histograms. The upper histogram shows how an exemplary distribution of $R_H$ and $R_L$ among a population of dual MTJ bit cells is associated with a wide distribution of average resistance values of the same population wherein the average resistance values might be used as a reference resistance in a reference circuit. The lower histogram shows that a tighter distribution of reference resistance values can be obtained by averaging $R_H$ and/or $R_L$ of plural bit cells to arrive at a reference resistance.

Figure 8:
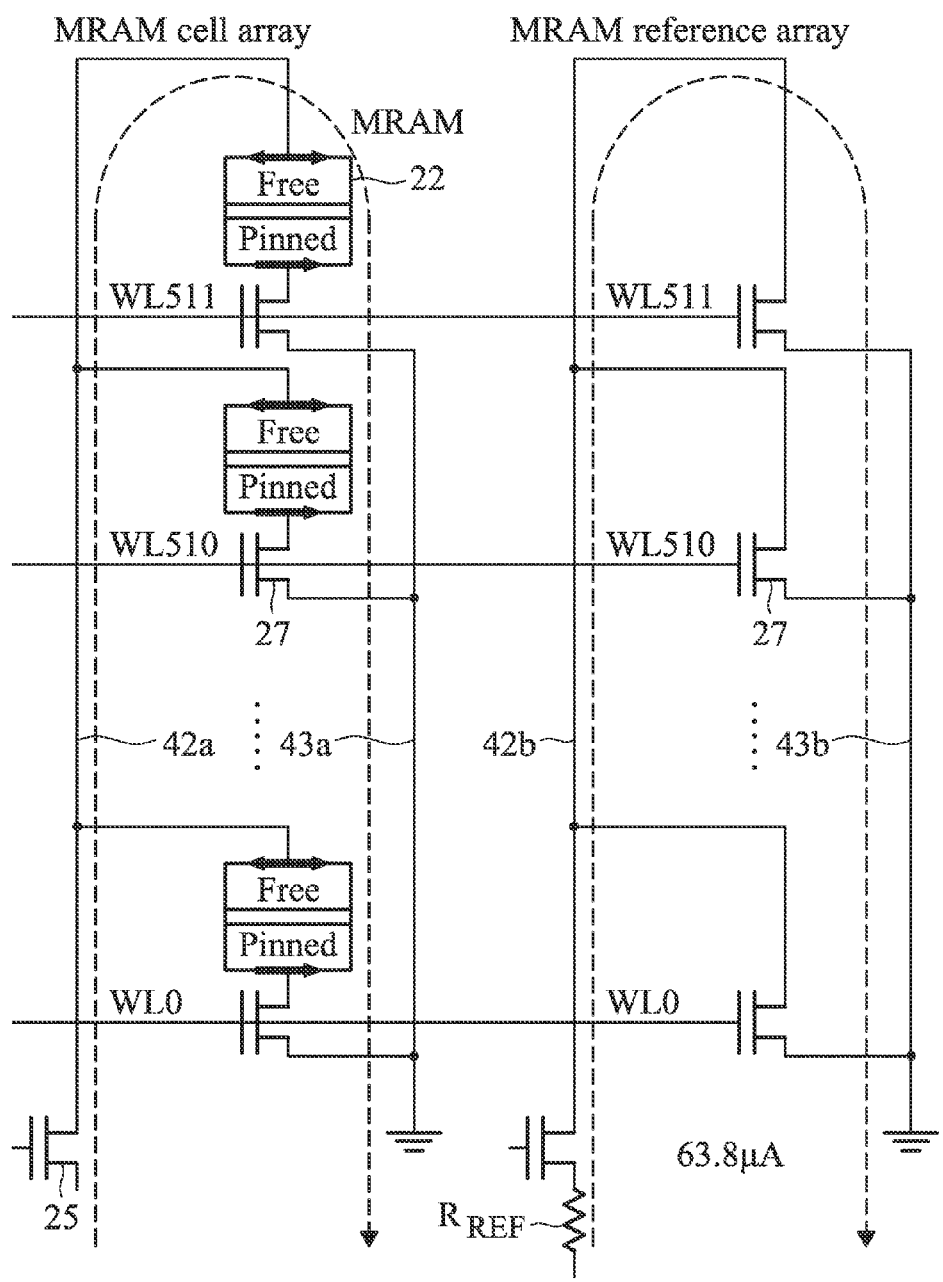

FIG. 8 is a schematic illustration showing a dummy addressed conductor for emulating the length of a bit line addressing conductor, the dummy conductor providing a resistance to offset the conductor resistance addressing a bit cell MTJ.

Figure 9:
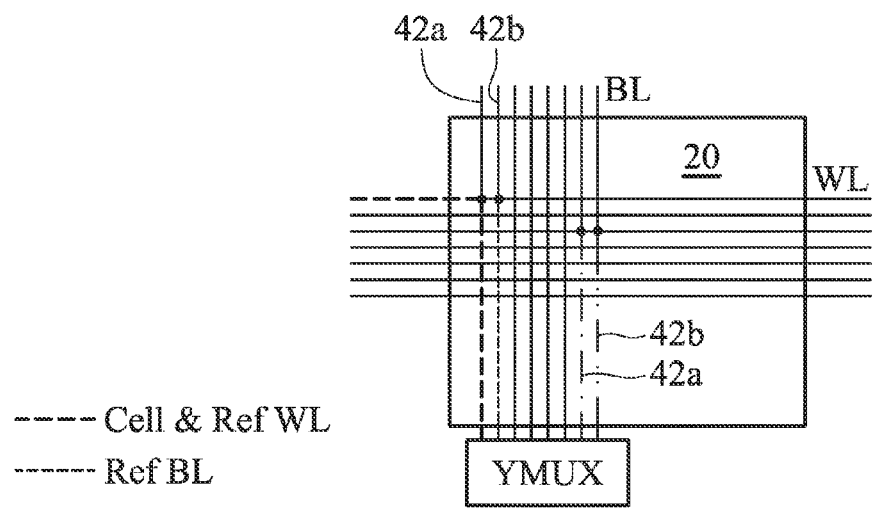

FIG. 9 is a schematic diagram showing that selecting a crossing bit line position in a crossing grid of poly-silicon conductors is useful for tracking the bit line conductor length as in FIG. 8.

Figure 10:
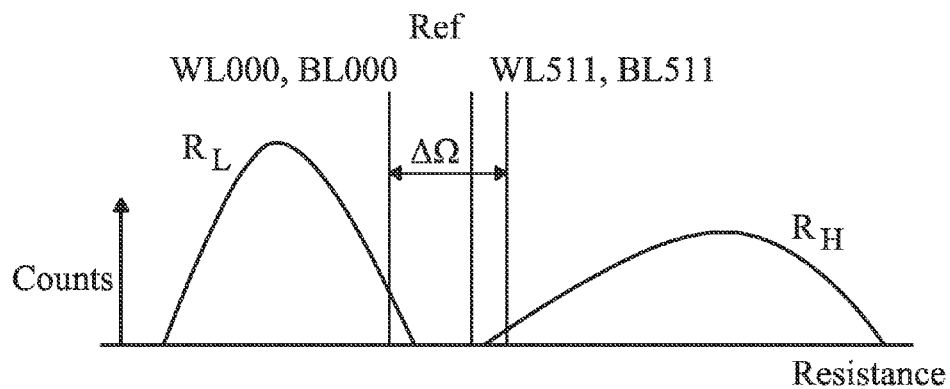

FIG. 10 is a histogram showing that the average of $R_H$ and $R_L$ resistances (($R_H+R_L$)/2) is affected by the location of bit cells in an array of crossing word line and bit line positions, in particular due to the variations in the length of the bit line conductor.

Figure 11:
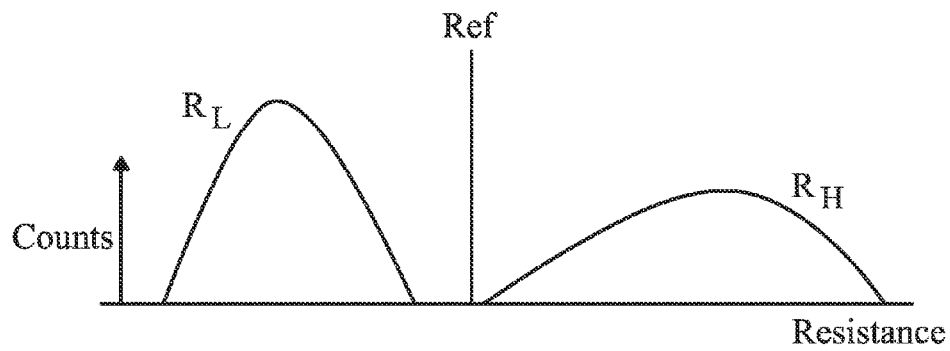

FIG. 11 is a histogram compared to FIG. 10, showing the selection of an ideal reference resistance by compensating for differences in bit line conductor length.

Figure 12:
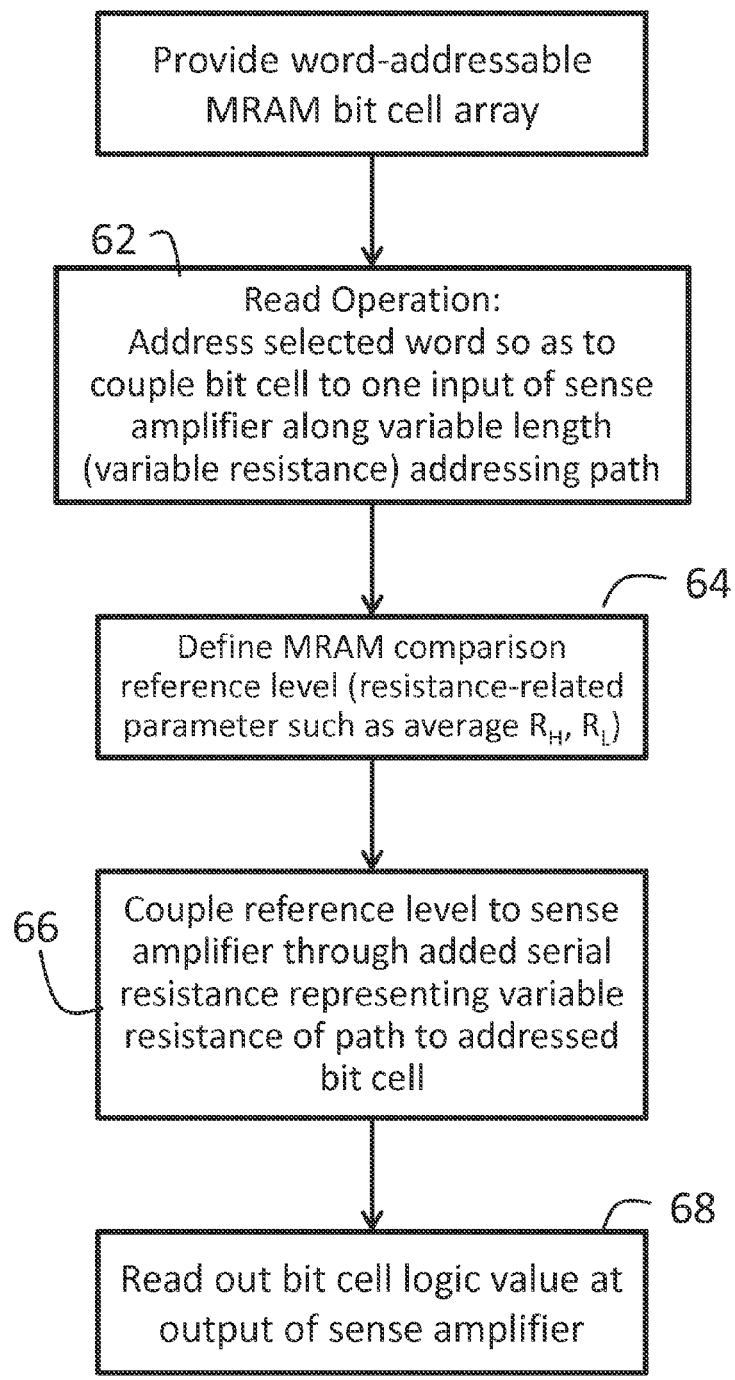

FIG. 12 is a flowchart demonstrating the method disclosed herein for discriminating between high and low resistance states of memory bits in a magneto-resistive memory, including inserting offsetting the length-variable resistance of the bit line conductor.

DETAILED DESCRIPTION

A memory bit cell using magnetoresistive techniques as provided herein uses at least one magnetic tunnel junction (MTJ) element for each bit cell. Each MTJ element comprises two superimposed magnetic layers separated by a nonmagnetic barrier layer. One of the magnetic layers has a permanent magnetic field aligned in a given direction (the pinned layer) and the other magnetic layer has a changeable magnetic field alignment (the free layer).

The electrical resistance of the superimposed layers (namely the series resistance through the pinned, barrier and free layers) is different when the magnetic fields of the free and pinned layers are aligned with one another (parallel) versus when the magnetic fields of the free and pinned layers are opposite (anti-parallel). The MTJ element is in a low resistance state $R_L$ when the magnetic field alignments are parallel, or in a high resistance state $R_H$ when the magnetic field orientations of the two layers are anti-parallel.

The magnetic field alignment of the free layer can be forced into parallel or anti-parallel alignment with the pinned layer by passing a sufficient amplitude of current through the MTJ at one of two opposite current polarities. In that way, a logical one or zero data value is written into a bit cells that comprises one or more MTJ elements. The data stored in a bit cell is read out by discerning whether bit cell MTJ elements are in high or low resistance states so as to represent a one or zero. An object is to provide effective references for comparison when distinguishing the high or low resistance state of addressed bit cell MTJ elements.

According to certain embodiments of this disclosure, the reference value used as a basis for comparison to distinguish the high versus low resistance state of a bit cell MTJ element is based on the resistances of plural MTJ elements that serve as reference resistances. An example uses averages of plural reference MTJ elements to define one or more of an average high resistance, and average low resistance and an average of the high and low resistances of one or more MTJ elements taken together.

Variations in conductor resistance are inherent having in an array of bit cell MTJ elements of which some bit cells are located nearer to a sense amplifier (comparator) and others are farther from the sense amplifier. According to alternative embodiments or as additional aspects, such variations are offset by inserting into the comparison circuit a dummy resistance to emulate, within the reference circuit, the resistance of a conductor that switchably addresses the bit cell MTJ. A dummy conductor of substantially the same length as the addressing conductor can be a conductor in an conductor array that matches the conductors of the bit cell array but does not include MTJ bit cells.

Figure 1:
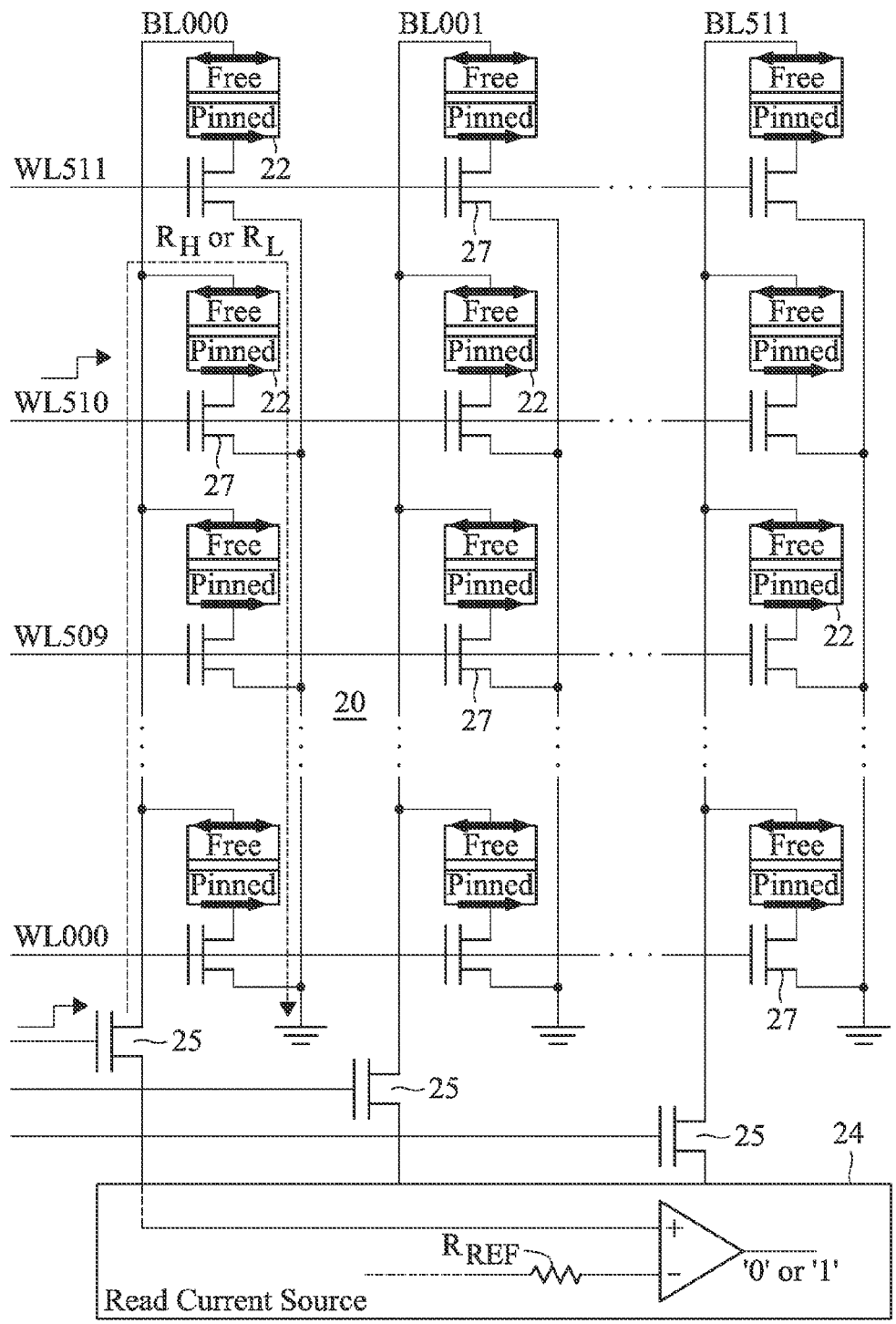

FIG. 1 schematically shows an exemplary array of single magnetic terminal junction (MTJ) elements 22 in an array such as an MRAM integrated circuit memory 20. Each MTJ element 22 occupies a position at which bit lines BLxxx and word lines WLxxx cross. When a bit line select transistor 25 and a word line select transistor are rendered conductive by input signals (such as BL000 and WL510), a current from a current source 24 (shown only generally) is conducted through the addressed bit cell MTJ element 22. For writing, the current source 24 can apply currents of opposite polarity for writing high or low resistance states into the addressed bit cell by forcing the free layer magnetic field into parallel or anti-parallel alignment with the magnetic field of the pinned layer. For reading, the current source 24 can apply a current at a predetermined reference amplitude (less than the amplitude that could effect a write operation) and discern from the voltage across the selected MTJ element whether the resistance state of the MTJ was high or low.

In FIG. 1, reading out the logic value of the bit cell is accomplished by determining whether the MTJ element is in its high or low resistance state compared to a fixed reference resistance $R_{REF}$. Although the comparison to be made is one of resistance, the typical technique is to compare voltages or currents that vary as a function of the resistance of the bit cell MTJ element. In the case of a voltage comparator, a read bias current of predetermined amplitude is passed through the bit cell MTJ element from the current source 24 and through the reference resistance $R_{REF}$, providing voltages according to Ohm's Law V=IR, which are coupled as inputs to a voltage comparator. The result of the comparison determines whether the stored logic value was a one or a zero.

It is desirable to choose a reference resistance (or a reference voltage or current parameter that varies with resistance) for comparison, wherein the reference is always between the actual $R_H$ and $R_L$ resistances for every one of the bit cell MTJ elements 22 to be read out, without exception. But the $R_H$ and $R_L$ resistances of the MTJ elements in the array 20 of bit cells are distributed over a population of which some MTJ elements have higher or lower resistances. If a fixed reference resistance is chosen, one or more of the MTJ elements in the population may have an $R_H$ that is less than then reference value, or an $R_L$ that is higher than the reference value. In any case, a fixed reference will not correspond to the midpoint between $R_H$ and $R_L$ for all the bit cell MTJ element. The fixed reference may be outside of the span of $R_H$ and $R_L$ for some bit cell MTJ elements, or at least within the offset of the comparator inputs, leading to an inability to accurately write and thereafter read out a stored data value in some logic states. For any given cell, $R_H$ is greater than $R_L$, but for randomly selected bit cell MTJ elements, an arguably ideal reference threshold (such as exactly halfway between the $R_H$ and $R_L$) will be different.

It is possible in a reference circuit to provide reference MTJ elements in high and/or low resistance states in a scheme to provide a reference resistance $R_{REF}$ that is nearer to ideal. If the reference MTJ elements are part of the same integrated circuit and are made in the same manufacturing process, one may expect that if the bit cell MTJ resistances trend high or low on that circuit, the reference MTJ resistances will also trend the same way.

Figure 2:
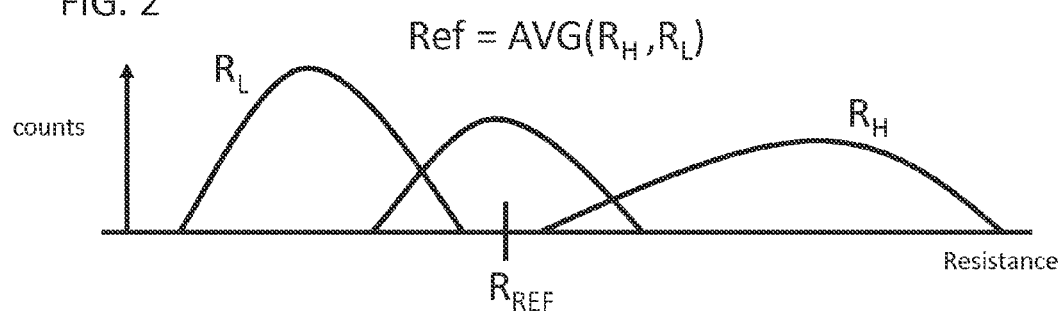

FIG. 2 is a histogram that illustrates a population of MTJ cells (which might be bit cell MTJ elements or MTJ elements used as references. The $R_H$ values have a statistical distribution. The $R_L$ values likewise have a statistical distribution. It may be possible to analyze a distribution of $R_H$ and $R_L$ values over the population and find a reference resistance $R_{REF}$ that is between the lowest high resistance $R_H$ of any bit cell and the highest low resistance $R_L$ of any bit cell (a situation exemplified by FIG. 2). But the margin of error between the lowest $R_H$ and the highest $R_L$ may be too close for dependable operation given comparator offsets and other resistance variations. If the populations of $R_H$ and $R_L$ overlap, it may not be possible to determine a value for $R_{REF}$ that will be effective for discerning $R_H$ and $R_L$ for every bit cell MTJ elements, and some of the bit cells may be defective.

Figure 3:
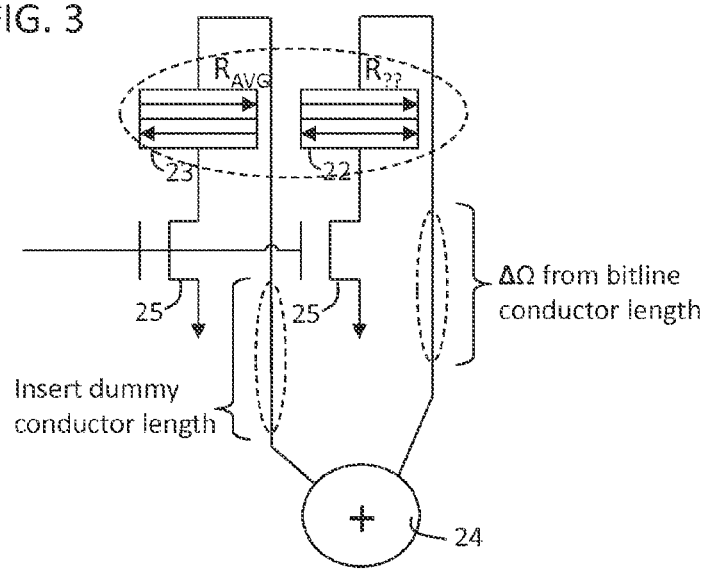
Figure 4:
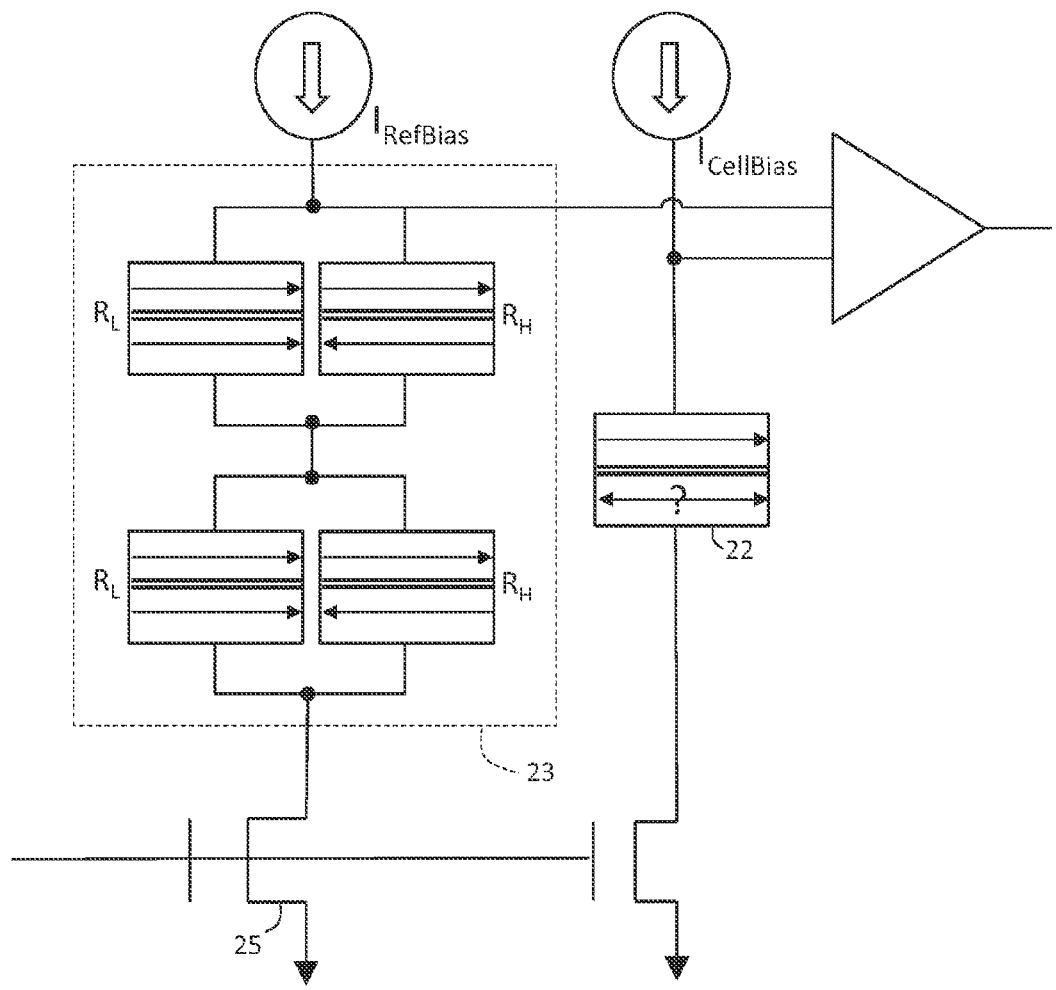
FIG. 4 is a photo showing an implementation comprising a voltage comparator.

It is usually the case that if the MTJ elements produced in a manufacturing operation have relatively high $R_H$ values, they also will have relatively high $R_L$ levels and vice versa. Where $R_H$ and $R_L$ track one another in that way, it may be possible to use a reference circuit containing MTJ elements that provide reference resistance values. The reference input to the comparator used to distinguish the high and low resistance states of different MTJ elements, for example, is the average of the $R_H$ and $R_L$ values of a reference bit cell, or is otherwise related to one or both of the $R_H$ and $R_L$ values of a reference MTJ element. Exemplary embodiments are shown in FIGS. 3 and 4. In FIG. 3, the reference element is identified as an average resistance. FIG. 4 shows a practical way in which a reference resistance can be obtained, providing a resistance that reflects manufacturing variations between circuit packages, by averaging the resistances of plural MTJ elements in high and low resistance states.

A comparison (such as a separate voltage comparator) is provided for each bit line and the MTJ bit cells of an addressed memory word are coupled to the comparators at their respective bit positions. Reference MTJ elements in a reference circuit 23 provide a comparison parameter at the input to the sense amplifier, shown in FIG. 4 as a voltage comparator. In one embodiment, equal read bias currents can be applied to reference circuit 23 and the addressed bit cell MTJ 22 to provide a basis for voltage comparison. In other embodiments disclosed herein, a current comparison can be obtained by coupling the reference circuit and the bit cell MTJ to equal voltage sources and comparing their resulting currents.

Figure 5:
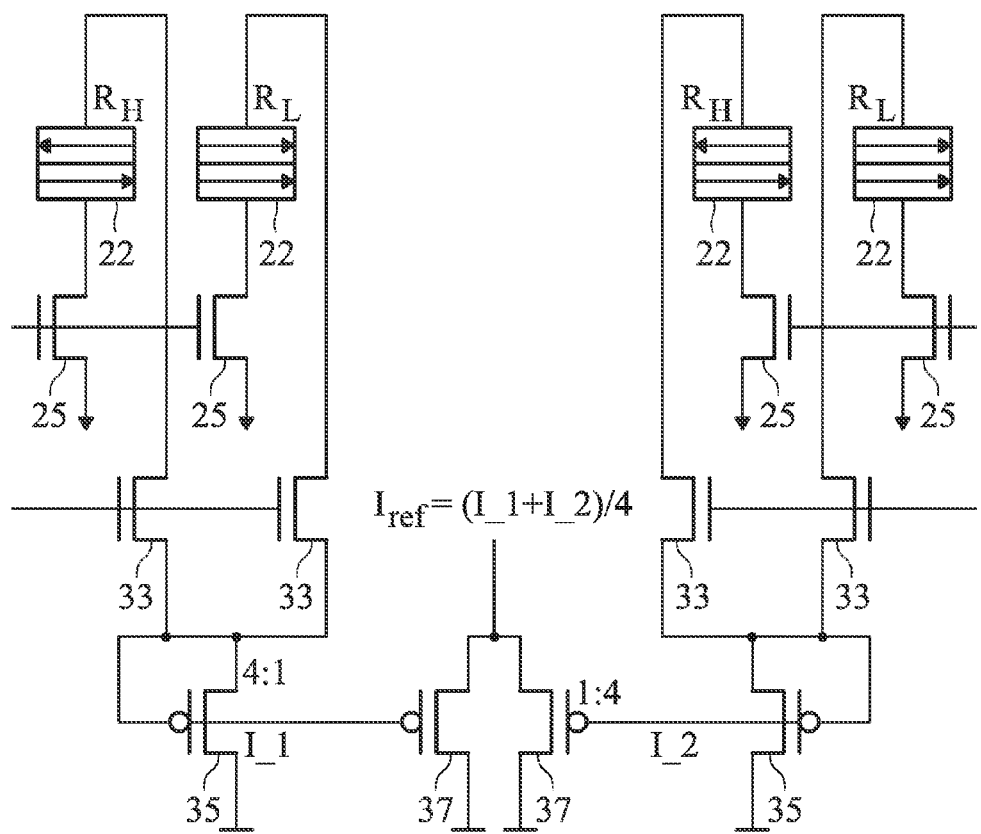
FIG. 5 is a schematic illustration of averaging currents from two instances of bit cells having dual complementary MTJs in opposite resistance states.
Figure 6:
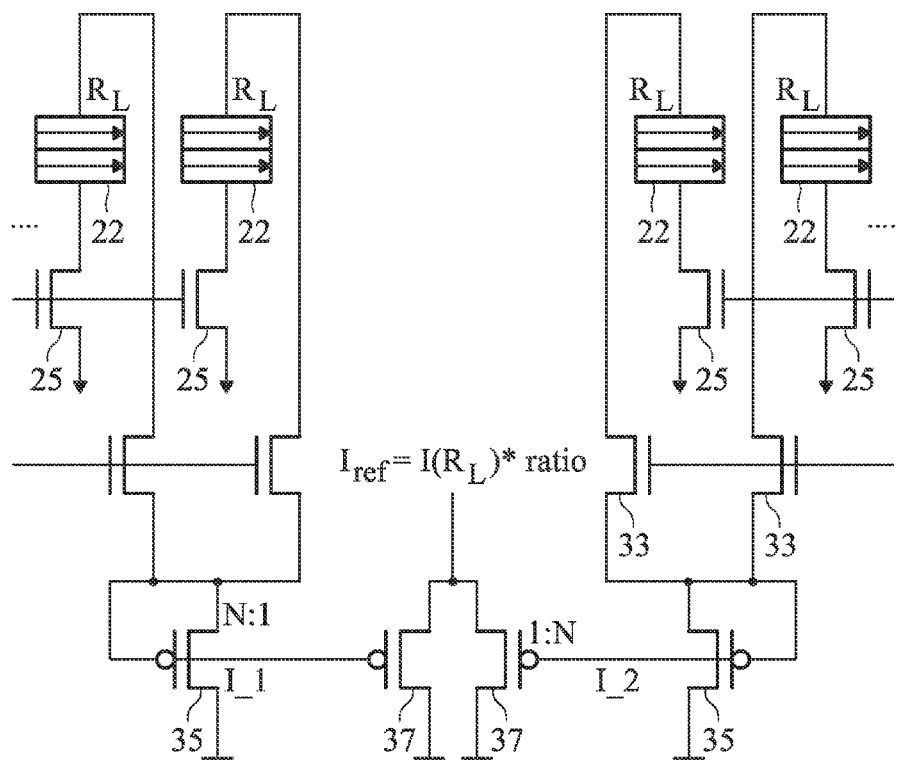
FIG. 6 is a schematic illustration of a summing and averaging currents from a plurality of N MTJ elements that are all in a same resistance state, in this example a low resistance state.

FIGS. 5 and 6 show schematic illustrations of exemplary embodiments for combining or averaging currents developed from plural instances of individual MTJ elements in a reference circuit. As shown in FIG. 7, averaging reference values produced by multiple MTJ elements tends to tighten the distribution of values for use as references in read operations. Thus, providing a reference based on averaging is useful for discerning whether bit cell MTJ elements are in their $R_H$ or $R_L$ states.

Referring to FIG. 5, in an embodiment wherein multiple MTJ elements 22 are used to develop a current level used as a threshold reference, a current source configuration provides switching transistors 33 and current summing transistors 35 to develop a current that is related to the sum of currents conducted by the MTJ elements 22. Transistor 35 adds the currents coupled through transistors 33 to the MTJ elements. Summing transistors 35 are coupled in a current mirror arrangement with parallel transistors 37. This configuration provides an output reference current $I_{ref}$ that is equal to the average of the currents in the respective MTJ elements 22.

In the embodiment of FIG. 5, the MTJ elements are shown in complementary resistance states in pairs of $R_H$ and $R_L$. Therefore, the pairs each produce at summing transistor 35 a current derived from an average of $R_H$ and $R_L$. When added by the current mirror transistors 37, the ultimate reference current is derived from the average of two instances of $R_H$ and two instances of $R_L$. It is possible in a similar manner to provide a reference current derived from other multiples of instances of $R_H$ and $R_L$, such as four or eight, etc.

In an embodiment wherein circuit configurations comprising a plurality of MTJ cells used to derive a current reference are disposed on the same integrated circuit as the bit cell MTJ elements being read, the reference MTJ elements and the bit cell MTJ elements have been subjected to the same manufacturing steps and have $R_H$ and $R_L$ resistance levels that are more comparable than resistance levels that might be found on circuits that were made in different manufacturing batches or otherwise were subjected to different conditions, especially affecting the thickness of the barrier layers between the magnetic layers of the MTJ elements.

According to FIGS. 5 and 6, at least one current summing transistor is coupled to a plurality of magnetic tunnel junction elements 22 through respective addressing transistors 25, 33, 35. The reference resistance (which in this case is represented by a current $I_{REF}$ to be coupled through a predetermined resistance) is based at least partly on a current conducted through one or more summing transistors 35. Likewise, at least one current mirror transistor 37 can be coupled to a plurality of said magnetic tunnel junction elements through respective addressing conductors coupled to a current source, so that the reference threshold and analogous resistance are based at least partly on a current conducted through the current mirror transistor 37.

FIG. 6 is a schematic illustration of a summing and averaging currents from a plurality of 'N' MTJ elements that are all in a same resistance state, this example showing four MTJ elements in a low resistance state. According to this embodiment, the MTJ elements need not be complementary pairs and can be a set of dummy MTJ elements used substantially only for developing a current signal to be used as a comparison threshold, e.g., to develop a voltage across a fixed resistor coupled to a voltage comparator, or to charge a capacitance. The current signal Iref=I($R_L$)*ratio, where the ratio can be reciprocal of the number of averaged MTJ cells, 1/N. As in the embodiment of FIG. 5, the currents from the MTJ elements through transistors 33 are summed at transistors 35 and coupled by a current mirror arrangement through parallel transistors 37, resulting in the current signal Iref that is used as a reference for comparison.

FIG. 7 is a histogram that generally shows the effect of averaging a number of resistances on the statistical distribution of reference signals. In this example, individual $R_H$ and $R_L$ resistances and averages of $R_H$ and $R_L$ are plotted. The distribution of the population has a relatively wide distribution shown in the upper part of FIG. 7. However if plural $R_H$ and/or $R_L$ resistances are averaged together and those averages, in turn, produce a reference resistance used for comparison, the distribution can be narrower, as shown on the bottom part of FIG. 7 because in an average the effects of outlying $R_H$ and $R_L$ are tempered.

The variations in $R_H$ and $R_L$ that produce the statistical distributions shown in FIG. 2 are primarily due to normal variations in manufacturing, e.g., from differences in the dimensions of the magnetic layers or the conductive layer that separates the magnetic layers. As mentioned, another variation in resistance results from the difference in the length of the bit line addressing conductors. In FIG. 1, the bit line conductors to the word or row at WL000 is shorter than the bit line conductor to the word or row at WL511. Another variation is provided by differences in the on-resistance of the switching transistors 25, as shown in FIG. 3. Each of these provides a resistance variation that adds uncertainty when seeking to define a threshold resistance level by which $R_H$ and $R_L$ resistance states can be discerned dependably for most or all of the bit cells MTJ elements 22.

The bit cell MTJ elements are located on the circuit at word line positions that are nearer to or farther from a current bias source and/or nearer to or father from the sense amplifier. In the embodiments of FIGS. 8 and 9, reference current voltage and current levels are adjusted to take into account and to offset the resistance of conductors that couple the addressed bit cell MTJ elements to the current source and/or sense amplifier. The resistance that needs to be offset varies with the length of bias current carrying conductors and that length varies according to the location on the circuit of the bit cell MTJ elements that are addressed. The conductor resistance contribute a length-related resistance to both the $R_H$ and $R_L$ resistance states of MTJ elements at the corresponding word lines.

FIG. 8 illustrates an embodiment wherein the resistance of a current path in an MRAM cell array is modeled by providing and operating an MRAM reference array to simulate the resistance encountered along the bit line addressing path through which current is coupled through MTJ elements at various different locations in the MRAM cell array. The series resistance of an MTJ element in a circuit include a variable length part of a bit line 42, namely as far as the word line transistor 27 that is conductive, and a return line 43 to ground. The sensed resistance includes the resistance $R_H$ or $R_L$ of the MTJ element and also the resistances of the included portion of the bit line and return conductors 42, 43. These conductors are typically made of poly-silicon and add a resistance that is of considerable effect when attempting to compare the resistance of an MTJ element 22 to a reference resistance $R_{REF}$. In this embodiment, the MRAM reference array is manufactured using similar conductors and has word line transistors 27 that are switched on at the same time as the counterpart word line transistor in the MRAM cell array. Thus the variation in bit line and return resistances due to addressing an MTJ element that is closer to or farther from the bit line transistor 25 can be cancelled as a complication in attempting to determine whether the MTJ resistance state is $R_H$ (presumably greater than $R_{REF}$ or $R_L$, (less than $R_{REF}$).

FIG. 9 shows an arrangement wherein poly-silicon bit line conductors BL and word line conductors WL intersect at bit cell positions in a grid array. Where the active MTJ cell or cells is found at the intersection of a word line and a bit line, the length of the reference bit line 42 (and return 43) is equal to the length of the cell bit line and return, and tracks the resistance. In FIG. 10, the optimal reference for threshold comparison varies with the position of the addressed bit cell from WL, BL 000,000 to 511, 511, but it may be necessary to adopt a single reference resistance. But by canceling the variation in resistance using an MRAM reference array as in FIG. 9, the optimal threshold comparison resistance ref can be used for all the bit cells regardless of their position Accordingly, a digital memory as described and shown in FIG. 1, has an array 20 of magnetoresistive memory bit cells, each of the bit cells comprising at least one magnetic tunnel junction element 22 having at least two magnetic layers in a stack including a pinned layer with a permanent magnetic field establishing a reference direction, and a free layer with a magnetic field component that is selectively alignable parallel to the reference direction, thereby providing a state of low electrical resistance through the stack, and anti-parallel to the reference direction, thereby providing a state of high electrical resistance through the stack. A current bias source 24 supplies current to at least a selected one of the bit cells, via word lines and bit lines in the embodiments shown. A comparison circuit 27 compares a resistance of the at least one magnetic tunnel junction element 22 of the selected bit cell to a reference resistance $R_{REF}$. The reference resistance is defined by the contributions of plural associated magnetic tunnel junction elements and/or by conductor resistance between a location of the magnetic tunnel junction element in the array 20 versus a location of one of a source of read bias current or voltage, and sense amplifier or comparator.

A predetermined resistance state or an average or another function based on two or more predetermined resistance states of one or more reference MTJ elements produce a parameter value that is compared against parameters produce by the resistance of at least one bit cell MTJ element that is addressed.

In certain embodiments, plural magnetic tunnel junction elements are used in generating the parameter representing a reference resistance. Groups of reference MTJ elements in their high resistance states and/or their the low resistance states can be coupled in a circuit, and the reference resistance is a function of values of some MTJ elements in both of said states, for example, an average of an equal number of $R_H$ and $R_L$ states can be taken. A value based on one or more instances of parallel resistance are used in some embodiments.

Addressing circuits (FIGS. 1, 8, 9) couple the bit cell magnetic terminal junction elements 22 to the current bias source 24 or the like, used in read operations, namely when comparing the resistance of an MTJ 22 to a reference resistance $R_{REF}$ using a comparison circuit such as a voltage comparator 27, for example, for comparing a resistance of the at least one magnetic tunnel junction element 22 of the selected bit cell to a reference resistance $R_{REF}$ to discern a logic value of the bit cell being read. Due to the addressing circuits, a conductor resistance and/or switching circuit resistance is added to at least one of a high resistance value $R_H$ and a low resistance value $R_L$ of a circuit that includes the magnetic junction element 22, the addressing circuits 42a, 43a, and the comparison circuit 27. The added resistance varies in part with the location of the at least one bit cell MTJ element 22 in the array 20 of bit cells. According to exemplary embodiments as disclosed, the reference resistance used in the comparison is adjusted or varied to take into account with the location of the subject magnetic tunnel junction element 22 in the array 20 of bit cells.

More particularly, the conductors 42a, 43a of the addressing circuit have resistances that vary with said location of the magnetic tunnel junction element in the array of bit cells. According to further examples, an offsetting resistance from a dummy addressing circuit having switches and conductors emulating those of the MTJ bit cell array but not MTJ elements, is coupled into the comparison circuit. The resistance of the dummy circuit at least partly cancels variation in the resistances with location (see broken lines in FIGS. 8 and 9).

In FIG. 9, the comparison addressing circuit 42b, 43b for providing said offsetting resistance substantially models the resistances of the conductors of the addressing circuit 42a, 43a. In particular, parallel running conductors of the MRAM cell array and the MRAM reference array are equal in length and character, except that the MRAM cell array includes the resistances of the MTJs 22, whereas the MRAM reference array includes the same length of conductors and the same sorts of switching transistors, etc., making up a model of all the same resistances except for that of the subject MTJ (000-511 in FIG. 8). The comparison circuit is configured to compare a resistance of a magnetic tunnel junction element 22 in a bit cell, alone against the reference resistance $R_{REF}$, alone. According to the disclosed embodiments, other contributing variations to resistance have been offset. Likewise, reference resistance $R_{REF}$ can be determined and used as the canceling resistance by the current bias and addressing circuits from a sum of a predetermined reference resistance and one of the addressed resistances of the comparison addressing circuit.

In one embodiment, the predetermined reference $R_{REF}$ actually is a fixed resistance as in FIG. 11, chosen after eliminating the effects of distance-related resistance variations ($\Delta\Omega$ in FIG. 10). In that case, the cancellation of variations related to conductor length render the fixed resistance more effective that it would be otherwise for discriminating the resistance state of bit cell MTJ elements being read out. Alternatively, the predetermined reference resistance $R_{REF}$ can be derived from a plurality of resistances that may vary with manufacturing conditions or similar resistance effects compared to the subject MTJ 22 whose resistance state is being discerned.

FIG. 12 is a flowchart representing the method steps involved in establishing and operating a magneto-resistive memory as described, at least with respect to read operations. Refer also to the schematic of FIG. 3, showing one bit cell. In FIG. 12, an MRAM array is configured with an array of bit cells grouped as memory words. Addressing a memory word couples the bits in the word to sense amplifiers 24 (step 62). Each addressed bit cell couples to one input of a sense amplifier a parameter such as voltage or current that varies with the resistance of at least one MTJ provided in the bit cell to represent a logic value by its $R_H$ or $R_L$ resistance state. A reference level is defined (step 64) to represent a same or related parameter, at a resistance falling between the expected values of the parameter at $R_H$ and $R_L$ resistances of the bit cell. The reference level is coupled to a second input of the sense amplifier 24 (step 66) but is not coupled directly. Instead, the reference level is coupled to the second input through a resistance in the reference circuit that offsets the resistance that has been placed into the connection between the bit cell MTJ and the first input of the sense amplifier by the conductor along which the bit cell was addressed. In the exemplary embodiments, the resistance inserted into the reference circuit is matched to the resistance of the path between the sense amplifier and the addressed bit cell MTJ (namely the bit cell at the bit position of the sense amplifier 24 in the memory word that has been addressed by transistors 25), because the inserted resistance is that of a dummy network of addressing conductors extending to bit positions that lack MTJ elements but have resistances that cancel the effects of the bit cell addressing conductors. In one embodiment, the dummy network resistances are of the same material and dimensions as the addressing conductors, although it is also possible to provide a dummy network that is otherwise arranged to offset the addressing conductor resistances. In any event, the bit cell logic value read out at the output of the sense amplifier 24 (step 68) is the result of a comparison in which the variable resistance of addressing conductors of varying length has been eliminated by the offsetting resistance, or at least tempered as a source of possible data-read error.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. A digital memory, comprising:
an array of magnetoresistive memory bit cells, each of the bit cells comprising at least one magnetic tunnel junction element having at least two magnetic layers in a stack including a pinned layer with a permanent magnetic field establishing a reference direction, and a free layer with a magnetic field component that is selectively alignable parallel to the reference direction, thereby providing a first state of electrical resistance through the stack, and anti-parallel to the reference direction, thereby providing a second state of electrical resistance through the stack;

a current bias source for supplying a current to at least a selected one of the bit cells coupled to a comparison circuit for comparing a resistance related parameter of the at least one magnetic tunnel junction element of the selected bit cell to a reference for distinguishing between the first and the second resistance states;

at least one current summing transistor coupled to the magnetic tunnel junction elements of the bit cells through their respective addressing conductors and to the current bias source, wherein the reference is based at least partly on a current summed and conducted through the summing transistor, and wherein the reference is based on at least one of a resistance of plural associated magnetic tunnel junction elements, and a resistance determined by a location of the selected bit cell in the array.

2. The digital memory of claim 1, wherein the reference is derived from plural reference magnetic tunnel junction elements on a same circuit with the array of bit cells, the plural reference magnetic tunnel junction elements having the first and the second resistance states contributing to the reference.

3. The digital memory of claim 1, wherein reference is derived from a reference resistance plus an offset resistance that is variable with a length of at least one conductor coupling one of the reference resistance and the selected bit cell to at least one of a bias source and a sense amplifier.

4. The digital memory of claim 3, wherein the plural magnetic tunnel junction elements are all in one of the first resistance state and the second resistance state, and the reference resistance is at least partly a function of an average of resistances in at least one of the states.

5. The digital memory of claim 3, wherein the reference is provided by a reference circuit comprising plural magnetic tunnel junction elements, some of which magnetic tunnel junction elements are in the first resistance state and other are in the second resistance state, wherein the reference resistance is a function of one of an average resistance and a parallel resistance of plural resistances of magnetic tunnel junction elements in each of the two states.

6. The digital memory of claim 3, wherein the reference is provided by a reference circuit having groups of plural magnetic tunnel junction elements that are in the first resistance state and the second resistance state, respectively, and wherein the reference resistance is at least partly a function of values in both of said states.

7. The digital memory of claim 6, wherein the values for at least one of the first and the second resistance states are based on an average resistance of the plural magnetic junction elements of at least one of the groups.

8. The digital memory of claim 6, wherein the values for at least one of the first and the second resistance states are based on a parallel resistance of the plural magnetic junction elements of at least one of the groups.

9. A digital memory, comprising:
an array of magnetoresistive memory bit cells, each of the bit cells comprising at least one magnetic tunnel junction element having at least two magnetic layers in a stack including a pinned layer with a permanent magnetic field establishing a reference direction, and a free layer with a magnetic field component that is selectively alignable parallel to the reference direction, thereby providing a first state of electrical resistance through the stack, and anti-parallel to the reference direction, thereby providing a second state of electrical resistance through the stack;

a current bias source for supplying a current to at least a selected one of the bit cells;

an addressing circuit having a plurality of addressing conductors for individually coupling at least one magnetic junction element of each of the bit cells to the current bias source;

a comparison circuit for comparing a resistance of the at least one magnetic tunnel junction element of the selected bit cell to a reference resistance;

at least one current summing transistor coupled to a plurality of said magnetic tunnel junction elements of the bit cells through their respective addressing conductors to the current bias source, and wherein the reference resistance is based at least partly on a current summed and conducted through the summing transistor;

wherein at least one of a first resistance value and a second resistance value of a circuit including the magnetic junction element, the addressing circuit and the comparison circuit varies with a location of the at least one magnetic tunnel junction element in the array of bit cells; and, wherein the reference resistance is varied with the location of the magnetic tunnel junction element in the array of bit cells.

10. The digital memory of claim 9, wherein the conductors of the addressing circuit have resistances that vary with said location of the magnetic tunnel junction element in the array of bit cells, and further comprising an offsetting resistance coupled to the comparison circuit that at least partly cancels variation in the resistances with said location.

11. The digital memory of claim 10, further comprising a comparison addressing circuit for providing said offsetting resistance, the comparison addressing circuit having addressed resistances that substantially model resistances of the conductors of the addressing circuit, and wherein the comparison circuit is configured to compare a resistance of a magnetic tunnel junction element in a bit cell as addressed through the addressing circuit against a sum of a predetermined reference resistance and one of the addressed resistances of the comparison addressing circuit.

12. The digital memory of claim 11, wherein the predetermined reference resistance comprises a fixed resistance.

13. The digital memory of claim 11, wherein the predetermined reference resistance comprises a plurality of resistances that vary with location in the array.

14. The digital memory of claim 9, wherein the magnetic tunnel junction elements in the array of bit cells are subject to manufacturing variations that produce differences in resistance of at least one of the first and the second resistance states of the magnetic junction elements at differing locations in the array, and wherein the predetermined reference resistance used for comparison against the resistance state of at least one magnetic tunnel junction in a bit cell at a given location in the array is based on resistances of other magnetic tunnel junction elements at locations near to the given location.

15. The digital memory of claim 14, wherein the other magnetic tunnel junction elements at locations near the given location comprise plural magnetic tunnel junction elements that are all in one of the first resistance state and the second resistance state, and the reference resistance is at least partly a function of an average of resistances in at least one of the states.

16. The digital memory of claim 14, wherein the other magnetic tunnel junction elements at locations near the given location comprise two groups of plural magnetic tunnel junction elements that are in the first resistance state and the second resistance state, respectively, and wherein the reference resistance is at least partly a function of values in both of said states that are one of averaged and determined as parallel resistance values.

17. The digital memory of claim 14, further comprising at least one current mirror transistor coupled to a plurality of said magnetic tunnel junction elements through respective addressing conductors coupled to a current source, and wherein the reference resistance is based at least partly on a current conducted through the current mirror transistor.

18. A method for discriminating between a first and a second resistance states of memory bits in a magneto-resistive memory, comprising:

providing an array of bit cell magnetic terminal junction elements arranged as addressable words of bit cells at bit cell positions;

during a read operation, addressably selecting the bit cell magnetic terminal junction elements in an addressable word for coupling the bit cells of the word to a source of bias current and to a sense amplifier for each said bit position, the sense amplifier at each bit position being configured to effect a comparison of a resistance related parameter of a respective said bit cell versus a reference value;

coupling a reference level to the sense amplifier as said reference value and reading out a logic value of the bit cell from an output of the sense amplifier;

wherein the reference level is affected by one of averaging an effect of at least two reference magnetic terminal junctions, and inserting an addressing conductor of a dummy conductor array when coupling the reference level to the sense amplifier, the addressing conductor of the dummy conductor array substantially offsetting a resistance of conductors addressing the selected bit cell; and wherein the reference is based at least partly on a current summed and conducted through a summing transistor coupled to the selected bit cell through the addressing conductor and coupled to a current source.

19. The method of claim 18, wherein the reference level is affected by both of averaging the effect of at least two reference magnetic terminal junctions, and inserting an addressing conductor of a dummy conductor array when coupling the reference level to the sense amplifier, substantially offsetting a resistance of conductors addressing the selected bit cell.

* * * * *